United States Patent [19]

Leung

[11] Patent Number: 4,672,023
[45] Date of Patent: Jun. 9, 1987

[54] METHOD FOR PLANARIZING WAFERS

[75] Inventor: Charles C. Leung, Fremont, Calif.

[73] Assignee: Avantek, Inc., Santa Clara, Calif.

[21] Appl. No.: 789,947

[22] Filed: Oct. 21, 1985

[51] Int. Cl.⁴ .......................................... H01L 21/312
[52] U.S. Cl. ..................... 430/311; 427/82;
427/88; 427/240; 430/329
[58] Field of Search .......................... 427/240, 82, 88;
430/311, 329

[56] References Cited

U.S. PATENT DOCUMENTS

| | | | |
|---|---|---|---|
| 3,976,524 | 8/1976 | Feng | 427/96 |
| 4,025,411 | 5/1977 | Hom-Ma | 151/643 |
| 4,379,833 | 4/1983 | Canavello | 427/96 |
| 4,427,713 | 1/1984 | White | 427/96 |

Primary Examiner—John D. Smith
Attorney, Agent, or Firm—Limbach, Limbach & Sutton

[57] ABSTRACT

A method for filling indentations to planarize the surface of a wafer is disclosed. The method includes three steps: (1) coating the wafer surface with a layer of positive photoresist that fills the indentations and covers the surface of the wafer; (2) exposing the layer of photoresist to light or other radiation source of such intensity and duration that the layer of photoresist is exposed down to the surface of the wafer but not into the indentations; and (3) removing the exposed portion of the photoresist by using a developer, resulting in a planarized wafer containing indentations filled with unexposed photoresist. Once the wafer has been planarized by this method, overstructures can be formed over the top of the photoresist filled indentations.

8 Claims, 5 Drawing Figures

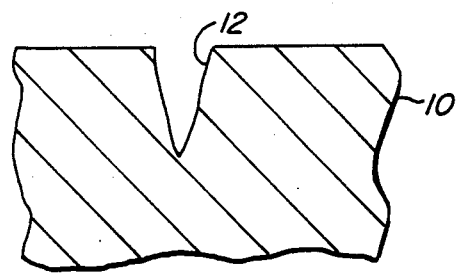
FIG.__1.
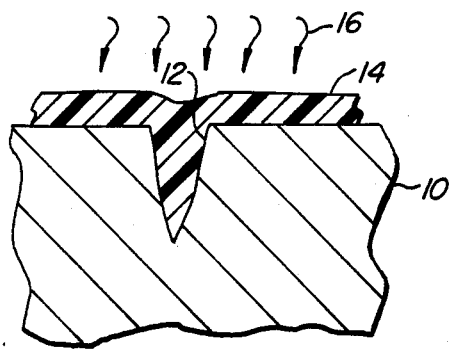
FIG.__2.
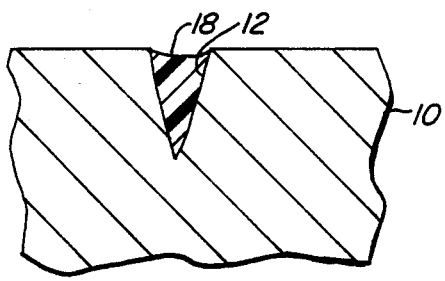
FIG.__3.
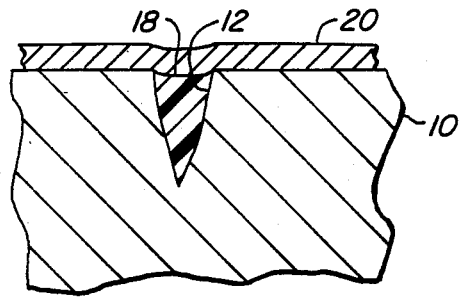
FIG.__4.
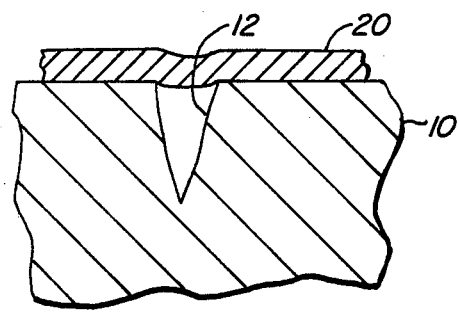
FIG.__5.

METHOD FOR PLANARIZING WAFERS

BACKGROUND OF THE INVENTION

1. Field of the Invention

This invention relates generally to processes and methods used in the manufacture of integrated circuit devices, and relates more particularly to a method for filling indentations to planarize the surface of a wafer.

2. Description of the Relevant Art

Grooves, trenches and other indentations are produced in semiconductor wafer processing either deliberately, as in trench isolation for integrated circuits, or incidentally, as in bird's head free oxide isolation using the nitride masked side wall method. Such indentations present obstacles to forming overstructures in subsequent processing steps. In the case of metal interconnect lines, for example, it is difficult to ensure electrical continuity when the interconnect line must span an indentation like an isolation trench that may be six to eight micrometers deep.

Others have attempted to solve this problem by coating the surface of the wafer with a layer of fill material such as oxide, nitride, or polysilicon to fill in the indentations, and then dry etching to remove the fill material layer down to the surface of the wafer, leaving the indentations filled with residual fill material. Unfortunately, this approach has not worked satisfactorily for a variety of reasons. First, the dry etching process does not consistently remove all of the fill material from the surface of the wafer, thereby causing problems during later processing steps. Second, the dry etching process is not selective enough to remove the fill material from the surface of the wafer but not the wafer material. Third, the application onto the wafer of some of the fill materials requires that the wafer be raised to a high temperature, which can stress the wafer material particularly at the boundaries between thin films of different coefficients of expansion and thereby destroy the usefulness of the transistors. The high temperature will also diffuse previously doped regions, making it impossible to hold the critical dimensions necessary for small geometry, high speed transistors or very large scale integrated circuits.

SUMMARY OF THE INVENTION

In accordance with the illustrated preferred embodiment, the present invention provides a method for filling indentations to planarize the surface of a wafer. The method includes three steps: (1) coating the wafer surface with a layer of positive photoresist of sufficient thickness and viscosity to fill the indentations and cover the wafer, leaving a flat, planar top surface; (2) exposing the layer of photoresist to light or other radiation of such intensity and duration that the layer of photoresist is exposed down to the surface of the wafer but not into the indentations; and (3) removing the exposed portion of the photoresist by using a developer, resulting in a planarized wafer containing indentations filled with unexposed photoresist.

If the thickness of the photoresist layer required for coating the wafer and filling the indentations is greater than the thickness that can be removed during one cycle of exposure and development, then steps (2) and (3) can be repeated until the surface of the wafer is reached.

Once the wafer has been planarized by this method, overstructures can be formed over the top of the photoresist filled indentations. As an additional step after the overstructures have been formed, the unexposed photoresist can be removed by a resist stripping reagent such as oxygen plasma or a solvent.

One important feature of the invention is its insensitivity to the intensity and duration of exposure radiation, given chosen combinations of photoresist type and exposure radiation. Normally, the thickness of exposed photoresist removable by subsequent development increases with the total energy of exposure, i.e., with both the intensity and duration. However, the intensity of the radiation diminishes as it penetrates the layer of positive photoresist due to absorption. The intensity of the exposure radiation diminishes to a negligble amount after penetration to a certain depth, which is determined by the absorption per unit volume, or the absorptivity, of the particular type of photoresist for exposure radiation of the particular wavelength. Thus, a maximum depth of penetration can be established for any combination of positive photoresist and radiation of a certain wavelength. When the absorptivity is high, as in the case of a Novolak type photoresist exposed to deep ultraviolet light with a wavelength in the range of 200 to 300 nanometers, the depth of penetration is on the order of one micrometer, which is typical of the thicknesses of photoresist required for planarization of wafers having indentations of similar dimensions. Thus, once the depth of penetration is determined by experimentation or calculation for a certain combination of photoresist and exposure radiation, the thickness of the photoresist used for planarization according to the method of the present invention can be chosen to be slightly less than that depth of penetration to ensure that all of the unwanted photoresist lying above the surface of the wafer will be exposed, while most of the photoresist in the indentations will not be exposed. Thus, all of the unwanted photoresist will be removed in the following development step. Overexposure and overdevelopment will not significantly affect the outcome of this planarization method.

Another key feature is that the method readily discriminates between the photoresist and the surface of the wafer. The incident radiation exposes all of the photoresist lying above the surface of the wafer, but the incident radiation has no damaging effect on the wafer. Minor variations in the process parameters such as initial resist thickness and the extent and uniformity of the thickness subsequently removed will only result in minor variations in the level of the resist remaining in the indentations, which, in most cases, can be overcome in the formation of the overstructures without leaving any discontinuity.

Another key feature is that the processing equipment necessary to practice the invention is readily available in the photolithography areas of all wafer fabrication lines in the semiconductor industry. Still another key feature is that the method of the invention is considerably less expensive and complicated than other competing methods.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTIONB OF THE DRAWINGS

FIG. 1 is a sectional detail view of a semiconductor wafer containing an indentation to be filled by the method of the present invention.

FIG. 2 is a sectional detail view of the wafer of FIG. 1 after a layer of positive photoresist has been applied to the surface of the wafer.

FIG. 3 is a sectional detail view of the wafer of FIG. 1 after the layer of photoresist has been exposed and developed, leaving the filled indentation.

FIG. 4 is a sectional detail view of the wafer of FIG. 1 after an overstructure has been formed over the filled indentation.

FIG. 5 is a sectional detail view of the wafer of FIG. 1 after the filled indentation has been cleared.

DETAILED DESCRIPTION OF THE PREFERRED EMBODIMENT

FIGS. 1 through 5 of the drawings depict various preferred embodiments of the present invention for purposes of illustration only. One skilled in the art will readily recognize from the following discussion that alternative embodiments of the structures and methods illustrated herein may be employed without departing from the principles of the invention described herein.

The preferred embodiment of the present invention is a method for filling indentations to planarize the surface of a wafer 10, shown in FIG. 1. The wafer 10 includes an indentation 12 that greatly complicates the formation of overstructures such as metal interconnect lines. The present invention solves this problem by filling in the indentation 12 to planarize the surface of the wafer 10.

The preferred embodiment of the invention includes three processing steps, as illustrated in FIGS. 2 and 3. In the first step, the upper surface of the wafer 10 is coated with a layer of positive photoresist 14. Preferably, the layer 14 is applied to a selected uniform thickness by the process of spin coating, which is a commonly used process for applying photoresist. In so applying, the photoresist enters into and fills the indentation 12. The photoresist is selected so that its viscosity is low enough for it to flow into the indentation 12, but high enough so that the upper surface of the photoresist layer does not cave in over the indentation. Ideally, the photoresist will completely fill the indentation 12, and the upper surface of the photoresist layer will be flat. The photoresist layer 14 has a substantially uniform thickness across the wafer 10, except for an increased thickness over the indentation 12.

In the second step, the upper surface of the photoresist layer 14 is uniformly irradiated by exposure radiation 16. The method of the present invention utilizes the fact that the exposure radiation will penetrate into the layer of positive photoresist only to a certain, predetermined depth, assuming at least a minimum duration of exposure. Normally, the thickness of exposed photoresist removable by subsequent development increases with the total energy of exposure, i.e., with both the intensity and duration. However, the intensity of the radiation diminishes as it penetrates the layer of positive photoresist due to absorption. The intensity of the exposure radiation diminishes to a negligible amount after penetration to a certain depth, which is determined by the absorption per unit volume, or the absorptivity, of the particular type of photoresist for exposure radiation of the particular wavelength. Thus, a maximum depth of penetration can be established for any combination of positive photoresist and radiation of a certain wavelength. When the absorptivity is relatively high, as in the case of a Novolak type photoresist exposed to deep ultraviolet light with a wavelength in the range of 200 to 300 nanometers, the depth of penetration is on the order of one micrometer, which is typical of the thicknesses of photoresist required for planarization of wafers having indentations of similar lateral dimensions.

Once the depth of penetration is determined by experimentation or calculation for a certain combination of photoresist and exposure radiation, the thickness of the photoresist layer 14 is chosen to be slightly less than that depth of penetration to ensure that all of the unwanted photoresist lying above the surface of the wafer 10 will be exposed, while most of the photoresist in the indentations 12 will not be exposed. Thus, the thickness of the photoresist layer 14 and the frequency, intensity, and duration of the exposure radiation are selected so that the layer 14 is fully exposed at least down to the upper surface of the wafer 10.

After exposure, the next step is to remove the exposed portion of the photoresist layer 14 by dissolving it in a developer solution. Prior to exposure, the positive photoresist material is not soluble in the developer. Exposure to the incident radiation changes the solubility of the photoresist material, and it becomes completely soluble in the developer. That portion of the photoresist that lies above the penetration depth of the exposure radiation is removed by the developer, while that portion of the photoresist that lies below the penetration depth of the exposure radiation remains in place. The result of the development step is illustrated in FIG. 3, which shows that all of the photoresist layer 14 above the surface of the wafer 10 has been removed, leaving a residual amount 18 of the photoresist in the indentation 12.

The wafer 10 is now effectively planarized, and overstructures, such as a metal interconnect line 20, can be formed on top of the surface. The line 20 is supported by the residual 18 of the photoresist in the area of the indentation 12, as shown in FIG. 4.

In some cases, the thickness of the photoresist layer 14 that is required to effectively planarize the wafer in the first step of the planarization method is greater than the penetration depth of the chosen exposure radiation. A relatively thicker photoresist layer is required to cover relatively larger or deeper indentations. In such cases, either a different photoresist or exposure radiation, or both, can be chosen. Alternatively, a thickness equal to a known multiple of the penetration depth can be removed by multiple repeated cycles of exposure and development. Thus, the method of the present invention is flexible enough to planarize wafers having indentations of the range of dimensions typically found in wafer processing.

As an optional step, the residual 18 of the photoresist in the indentation 12 can be removed after the overstructures have been formed. Preferably, such removal is accomplished by a resist stripping method such as oxygen plasma or solvent stripping. As shown in FIG. 5, the result of this optional step is an air gap under the interconnect line 20, which now bridges the indentation 12.

It has been found that the method of the present invention operates particularly well in planarizing wafer having indentations on the order of one micrometer wide by using a Novolak type of positive photoresist for the photoresist layer 14. In particular, a type AZ-1470 positive photoresist has been applied by spin coating a wafer rotating at about 5000 revolutions per minute to form a photoresist layer 14 at a thickness of about one micrometer. This wafer has been exposed to a deep ultraviolet radiation at a wavelength of about 220 nanometers for a period of about one minute at an intensity of about six milliwatts per square centimeter.

From the above description, it will be apparent that the invention disclosed herein provides a novel and advantageous method for filling indentations to planarize the surface of a wafer. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A method for planarizing the surface of a wafer containing indentations, said method comprising the steps of:
   coating the wafer surface to be planarized by applying a layer of positive photoresist that fills the indentations and covers the surface of the wafer, said layer of positive photoresist having a substantially uniform thickness over the wafer surface except for an increased thickness at the indentations;
   uniformly exposing said layer of positive photoresist to a source of exposure radiation, wherein said exposure radiation penetrates said layer of positive photoresist down to the surface of the wafer but not all the way into the depths of the indentations; and
   developing said layer of positive photoresist to remove the exposed portion of said layer from the surface of the wafer, resulting in a planarized wafer containing indentations substantially filled with unexposed positive photoresist.

2. A method as recited in claim 1 wherein the wafer is a flat circular wafer, and wherein said step of coating the wafer surface includes the step of spinning the wafer while applying the positive photoresist in order to obtain a uniformly thick layer of positive photoresist.

3. A method as recited in claim 1 further comprising the steps of forming a structure on the surface of the wafer and on top of the indentations filled with unexposed positive photoresist, and thereafter removing said unexposed positive photoresist from the indentations using a resist stripper.

4. A method as recited in claim 3 wherein said step of removing said unexposed positive photoresis includes the step of oxygen plasma or solvent stripping.

5. A method as recited in claim 1 further comprising the steps of selecting a thickness for the layer of positive photoresist and selecting the frequency, intensity, and duration of said exposure radiation so that said exposure radiation penetrates said layer of positive photoresist at least down to the surface of the wafer but not into the indentations.

6. A method as recited in claim 1 wherein said step of coating the wafer surface includes the step of coating the wafer surface with type AZ-1470 esist and spinning the wafer at a rotational speed of about 5000 revolutions per minute to obtain a layer thickness of approximately one micrometer, and wherein said step of uniformly exposing includes the step of exposing said layer of positive photoresist using deep ultraviolet light at a wavelength of about 220 nanometers.

7. A method as recited in claim 6 wherein said step of exposing with deep ultraviolet light includes the step of exposing said layer of positive photoresist with deep ultraviolet light for a period of approximately one minute at an intensity of approximately six milliwatts per square centimeter.

8. A method for planarizing the surface of a wafer containing indentations, said method comprising the steps of:
   coating the wafer surface to be planarized by applying a layer of positive photoresist that fills the indentations and covers the surface of the wafer, said layer of positive photoresist having a substantially uniform thickness over the wafer surface except for an increased thickness at the indentations;
   uniformly exposing said layer of positive photoresist to a source of exposure radiation;
   developing said layer of positive photoresist to remove the exposed portion of said layer;
   repeating said steps of exposing and developing said layer of positive photoresist until said layer of positive photoresist is removed down to the surface of the wafer, resulting in a planarized wafer containing indentations substantially filled with unexposed positive photoresist.

* * * * *